United States Patent
Svensson et al.

(10) Patent No.: US 12,044,978 B2
(45) Date of Patent: Jul. 23, 2024

(54) BEAM POSITION IMAGE OPTIMIZATION

(71) Applicant: Mycronic AB, Taby (SE)

(72) Inventors: Anders Svensson, Sollentuna (SE); Fredric Ihren, Taby (SE)

(73) Assignee: Mycronic AB, Taby (SE)

( * ) Notice: Subject to any disclaimer, the term of this patent is extended or adjusted under 35 U.S.C. 154(b) by 0 days.

(21) Appl. No.: 17/997,692

(22) PCT Filed: May 21, 2021

(86) PCT No.: PCT/EP2021/063594
§ 371 (c)(1),
(2) Date: Nov. 1, 2022

(87) PCT Pub. No.: WO2021/254726
PCT Pub. Date: Dec. 23, 2021

(65) Prior Publication Data
US 2024/0012336 A1    Jan. 11, 2024

(30) Foreign Application Priority Data

Jun. 17, 2020   (EP) .................................... 20180441

(51) Int. Cl.
*G03F 7/00*   (2006.01)
(52) U.S. Cl.
CPC ...... *G03F 7/70491* (2013.01); *G03F 7/70383* (2013.01)
(58) Field of Classification Search
CPC ............. G03F 7/70383; G03F 7/70491; G03F 7/70516
See application file for complete search history.

(56) References Cited

U.S. PATENT DOCUMENTS

| | | | |
|---|---|---|---|
| 7,919,218 B2 | 4/2011 | Sjostrom | |
| 2002/0118350 A1 | 8/2002 | Cabiri et al. | |
| 2009/0197188 A1 | 8/2009 | Sjostrom | |
| 2009/0262319 A1* | 10/2009 | Matsuura | G03F 7/70433 355/53 |

(Continued)

OTHER PUBLICATIONS

European Search Report For European Patent Application No. 20180441 dated Dec. 9, 2020.
(Continued)

*Primary Examiner* — Peter B Kim
(74) *Attorney, Agent, or Firm* — Harness, Dickey & Pierce, P.L.C.

(57) ABSTRACT

A method for obtaining a compensation pattern for a workpiece patterning device comprises printing (S11) a calibration pattern with a plurality of simultaneously operating exposure beams being sweepable in a second direction according to calibration pattern print data having a multitude of edges. Positions of the edges are measured (S12). Deviations of the measured positions relative calibration pattern are calculated (S13). Each deviation is associated (S14) with a used exposure beam, with a sweep position and a grid fraction position. Edge compensating data is computed (S15) for adapting edge representations of pattern print data prior to printing to compensate for the calculated deviations. The edge compensating data is dependent on the used exposure beam, the sweep position, and the grid fraction position.

20 Claims, 10 Drawing Sheets

(56) References Cited

U.S. PATENT DOCUMENTS

2016/0254121 A1    9/2016    Amir

OTHER PUBLICATIONS

International Search Report for International Application No. PCT/EP2021/063594 dated Jul. 29, 2021.
T. Sandstrom et al. "Mask and Lithography Techniques for FPD", Proceedings of SPIE, IEEE, US, vol. 9661, Sep. 4, 2015 (Sep. 4, 2015) pp. 966103-966103.

* cited by examiner

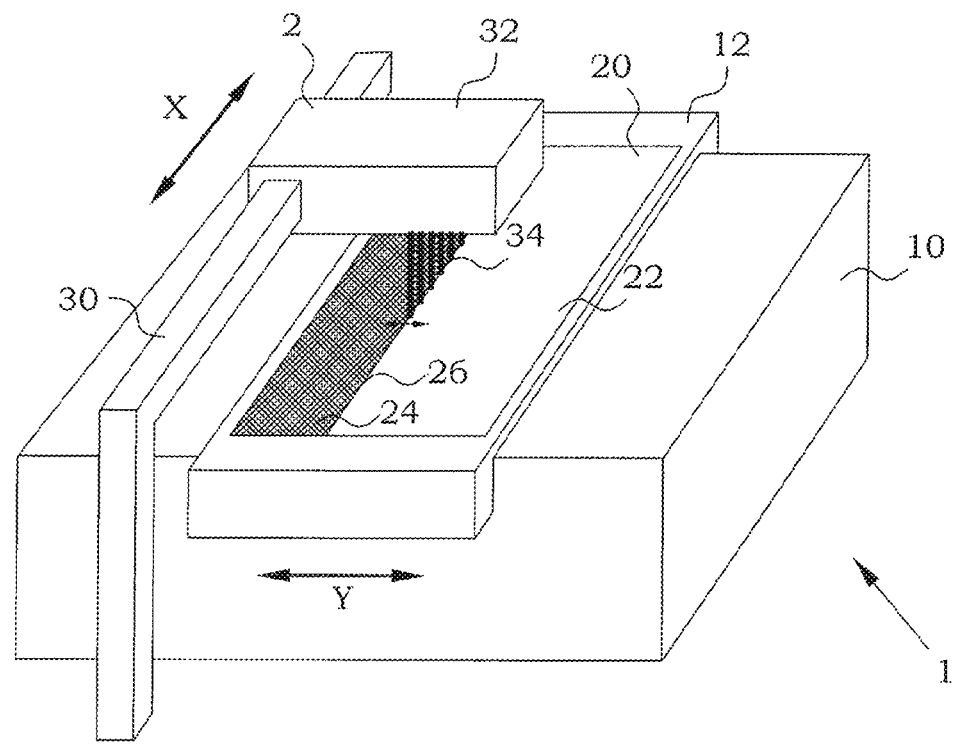
Fig. 1
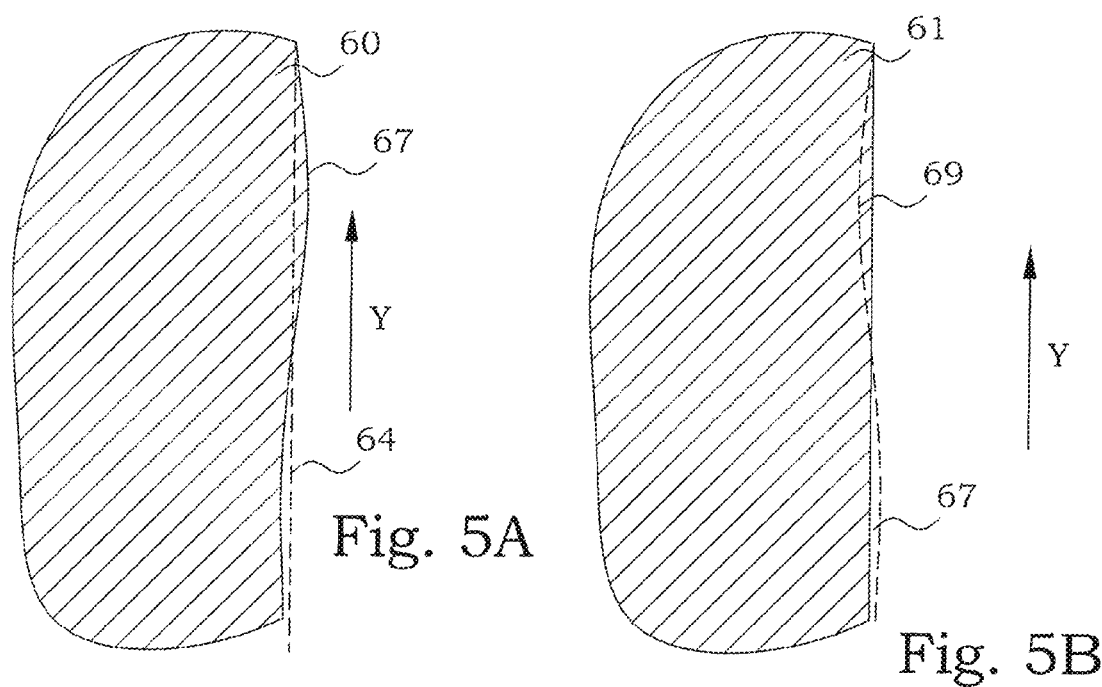
Fig. 5A
Fig. 5B

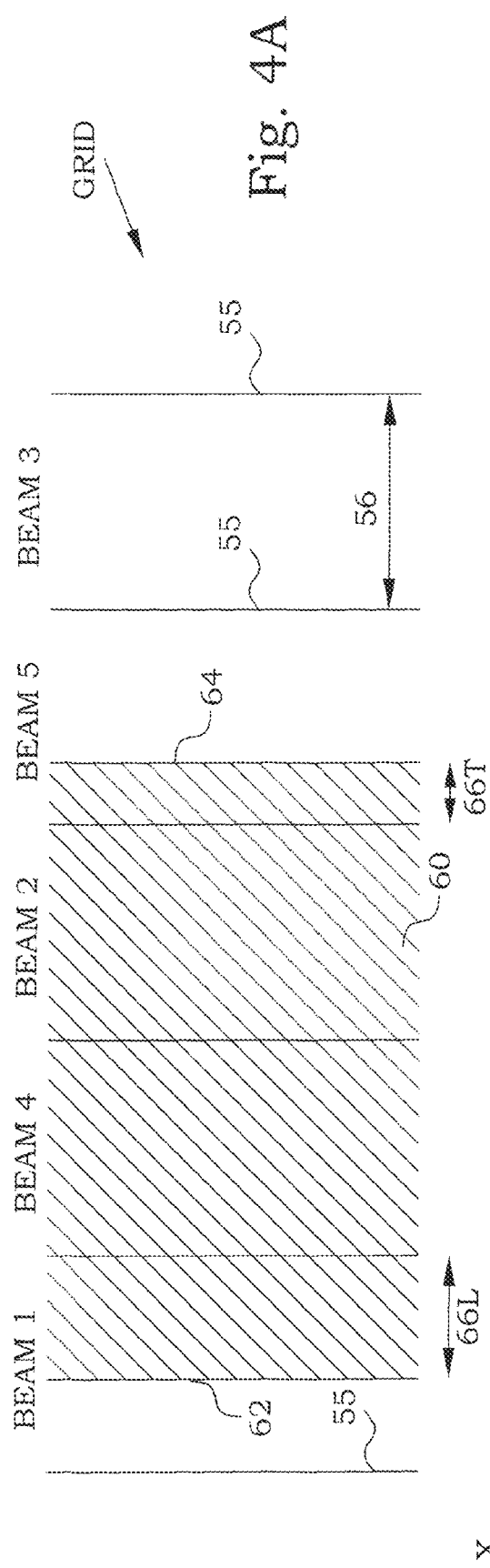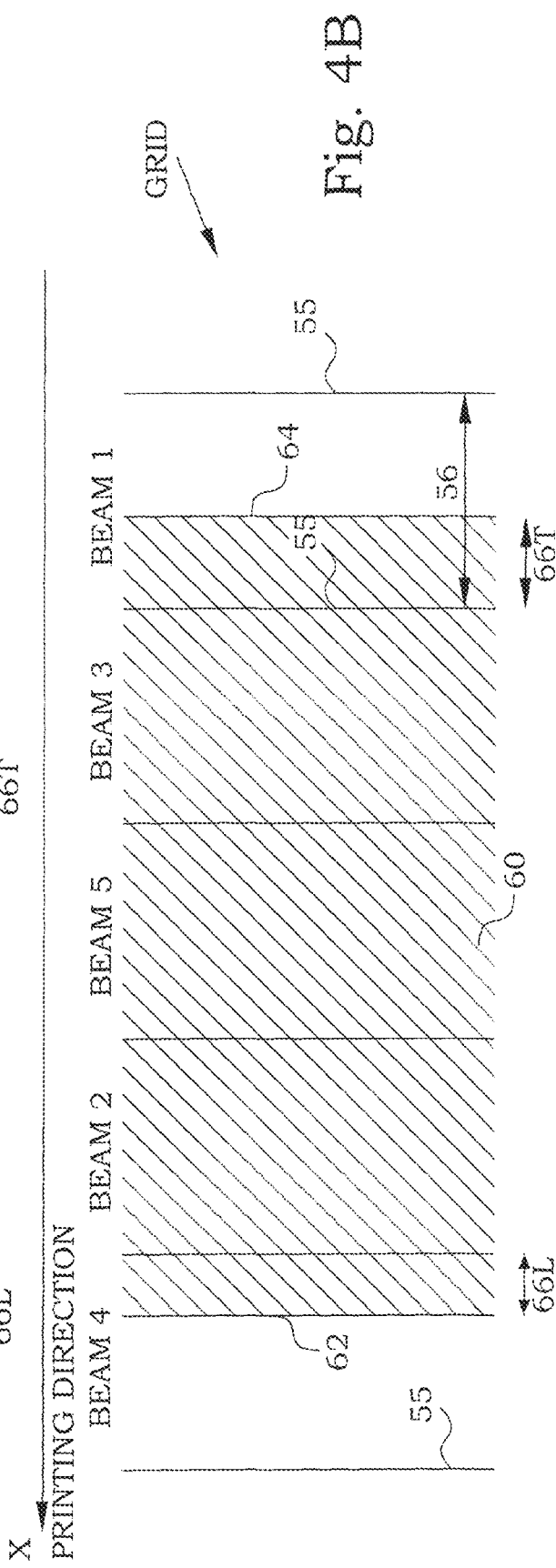

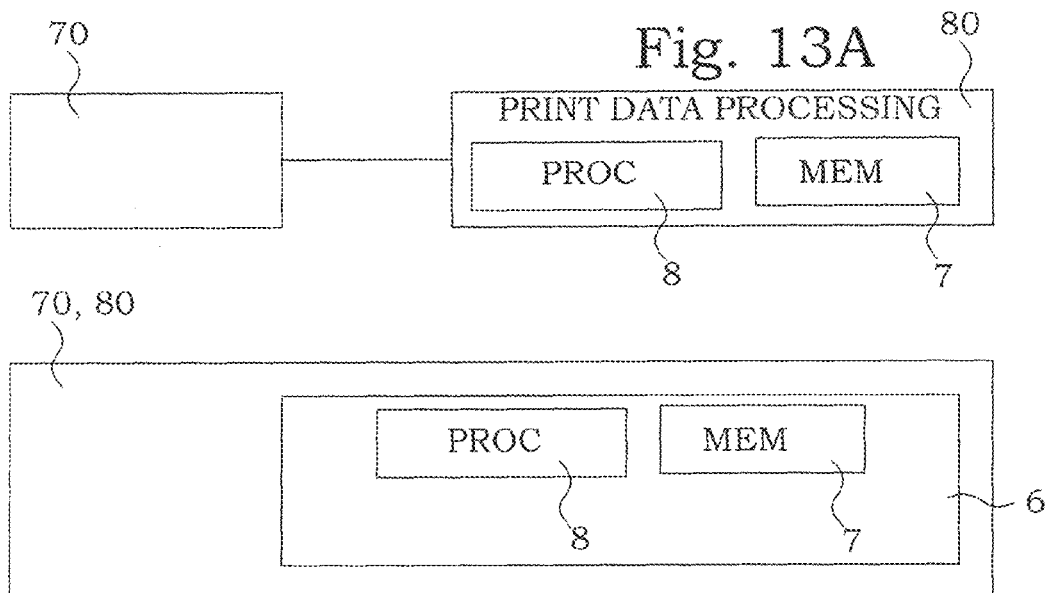
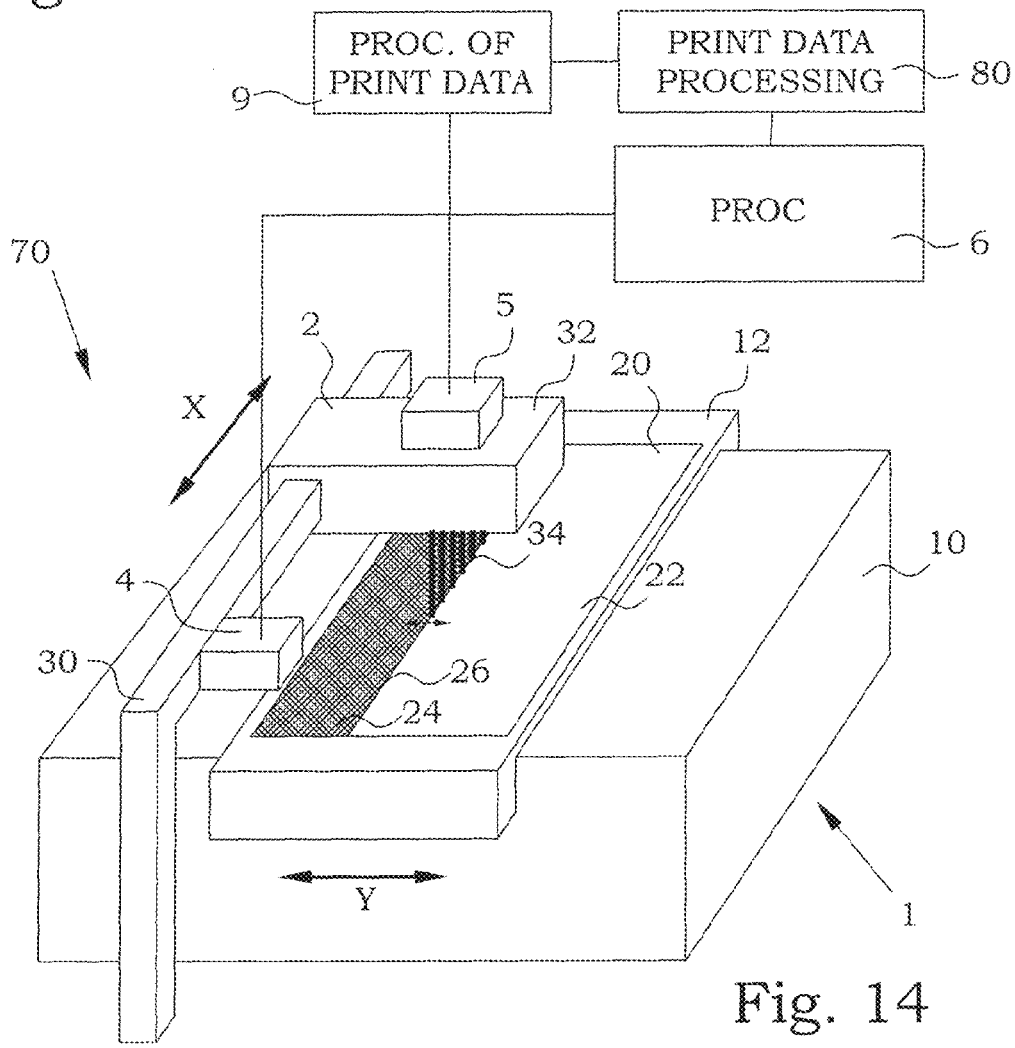

BEAM POSITION IMAGE OPTIMIZATION

CROSS-REFERENCE TO RELATED APPLICATIONS

This application is a national phase under 35 U.S.C. § 371 of PCT International Application No. PCT/EP2021/063594 which has an International filing date of May 21, 2021, which claims priority to European Patent Application No. 20180441.6, filed Jun. 17, 2020, the entire contents of each of which are hereby incorporated by reference.

TECHNICAL FIELD

The present technology relates to pattern printing and devices therefore and in particular to a method for obtaining a compensation pattern for a workpiece patterning device, a method for calibrating print data, a method for printing a pattern and devices therefore.

BACKGROUND

In the semiconductor industry today, masks produced by laser-based mask writers are common for use for manufacturing of different kinds of advanced chips and image devices. Direct writers for e.g. electronic packaging are also standard today. During the last years, the production of larger and more accurate displays has also increased tremendously. Demands are therefore put e.g. on micro-lithographic printing processes to be faster, more accurate and less expensive.

In the field of micro-lithographic printing processes mask writers or direct writers may be based on a printing head providing one or several precision laser beams. The printing head and a substrate to which the writing is intended to be performed are movable relative to each other, either by moving the printing head or the substrate or both. By varying the power of the laser beam coordinated with the relative motion, an exposure pattern can be written onto the substrate.

By the use of a printing head having multiple beams for simultaneous exposure, the overall speed can be increased. Furthermore, by also allowing the beams to be swept a small distance in a direction perpendicular to the main motion direction of the printing head, the width of the printed strip is increased, which also increases the overall printing speed.

Precision of the prints is of crucial importance. Deviations from the intended pattern, e.g. critical dimensions (CD) or positioning errors, even in the range of a few to some hundred nanometers may be harmful or degrading for the final result. Such printing errors are typically caused by imperfections in the mechanical and/or optical properties of the printing head.

In the published U.S. Pat. No. 7,919,218 B2, a method for a multiple exposure beams lithography tool is disclosed. A method for patterning a workpiece covered with a layer sensitive to electromagnetic radiation by simultaneously using a plurality of exposure beams is described. It is determined if any of the beams have an actual position relative to a reference beam which differs from its intended position. An adjustment of the exposure dose for a wrongly positioned beam is performed if said beam is printed at an edge of a feature.

Such corrections are designed to correct for beam position errors, but deviations from the intended pattern can depend on many other reasons as well, which cannot be compensated by such an exposure adjustment.

SUMMARY

A general object of the present technology is to provide means for correction of more general type imperfections of printing heads.

The above object is achieved by methods and devices according to the independent claims. Preferred embodiments are defined in dependent claims.

In general words, in a first aspect, a method for obtaining a compensation pattern for a workpiece patterning device comprises printing of a calibration pattern with a plurality of simultaneously operating exposure beams separated in a first direction. The plurality of simultaneously operating exposure beams is sweepable in a second direction, transverse to the first direction. The printing is performed according to calibration pattern print data. The calibration pattern has a multitude of edges extending in the second direction. Positions of the edges in the first direction are measured for a plurality of sweep positions in the second direction in the printed calibration pattern. Deviations of the measured positions of the edges relative intended positions of the edges according to the calibration pattern print data are calculated. Each deviation is associated with a used exposure beam among the simultaneously operating exposure beams that is responsible for the printing of the respective edge, with a sweep position of the plurality of positions in the second direction at which the edge was printed and with a grid fraction position in the first direction of the exposure beam among the simultaneously operating exposure beams that is responsible for the printing of the respective edge. The grid fraction position is the intended position of the edge relative to an edge of an intended coverage area of the exposure beam among the simultaneously operating exposure beams that is responsible for the printing the respective edge. Edge compensating data for adapting edge representations of pattern print data prior to printing are computed to compensate for the calculated deviations. The edge compensating data is dependent on the used exposure beam, the sweep position in the second direction and the grid fraction position in the first direction.

In a second aspect, a method for calibrating print data comprises obtaining of print data of the pattern to be printed. The print data is adapted by edge compensating data obtained by a method according to the first aspect into edge compensated print data.

In a third aspect, a method for printing a pattern comprises obtaining of edge compensated print data, obtained by a method according to the second aspect, of the pattern to be printed. A printing process of a workpiece covered at least partly with a layer sensitive to electromagnetic or electron radiation is controlled based on the edge corrected print data.

In a fourth aspect, a system for obtaining a compensation pattern for a workpiece patterning device comprises a printing device configured for creating a calibration pattern with a plurality of simultaneously operating exposure beams separated in a first direction. The plurality of simultaneously operating exposure beams is sweepable in a second direction, transverse to the first direction. The printing device is configured to perform the printing according to calibration pattern print data. The calibration pattern has a multitude of edges extending in the second direction. A measuring device is arranged for measuring positions of the edges in the first direction for a plurality of sweep positions in the second direction in the calibration pattern. A processing device is configured for calculating deviations of the measured positions of the edges relative intended positions of the edges according to the calibration pattern print data. The processing device is further configured for associating each deviation with a used exposure beam among the simultaneously operating exposure beams that is responsible for the printing the respective edge, with a sweep position of the plurality of positions in the second direction at which the edge was printed and with a grid fraction position in the first direction of the exposure beam among the simultaneously operating exposure beams that is responsible for the printing the respective edge. The grid fraction position is the intended position of the edge relative to an edge of an intended coverage area of the exposure beam among the simultaneously operating exposure beams that is responsible for the printing the respective edge. The processing device is further configured for computing edge compensating data for adapting edge representations of pattern print data prior to printing to compensate for the calculated deviations. The edge compensating data is dependent on the used exposure beam, the sweep position in the second direction and the grid fraction position in the first direction.

In a fifth aspect, a device for processing print data defining a pattern to be printed comprises a processing circuitry and a memory. The memory comprises instructions executable by the processing circuitry, whereby the processing circuitry is operative to obtain print data for the pattern to be printed and to adapt the print data by edge compensating data obtained by a system for obtaining a compensation pattern according to the fourth aspect into edge compensated print data.

In a sixth aspect, a printing device comprises a device for processing of edge compensated print data obtained by a device for processing print data according to the fifth aspect. The printing device is the printing device of the system for obtaining a compensation pattern for a workpiece patterning device of the fourth aspect. The printing device further comprises a printing head having a plurality of simultaneously operating exposure beams separated in a first direction. The plurality of simultaneously operating exposure beams is sweepable in a second direction, transverse to the first direction. The printing device further comprises a control unit. The control unit is arranged to control an operation and relative motion of the printing head based on the edge compensated print data.

One advantage with the proposed technology is that a large variety of imperfections in the optical and/or mechanical properties of a printing head are possible to compensate for. Other advantages will be appreciated when reading the detailed description.

BRIEF DESCRIPTION OF THE DRAWINGS

The invention, together with further objects and advantages thereof, may best be understood by making reference to the following description taken together with the accompanying drawings, in which:

FIG. 1 illustrates schematically a printing device;

FIGS. 4A-B illustrate examples of calibration pattern lines in relation to a beam grid;

FIGS. 5A-B illustrate compensation for edge deviances;

FIGS. 13A-B are schematic drawings of an embodiment of a device for processing print data defining a pattern to be printed; and FIG. 14 is a schematic drawing of an embodiment of a printing device.

DETAILED DESCRIPTION

Figure 2:
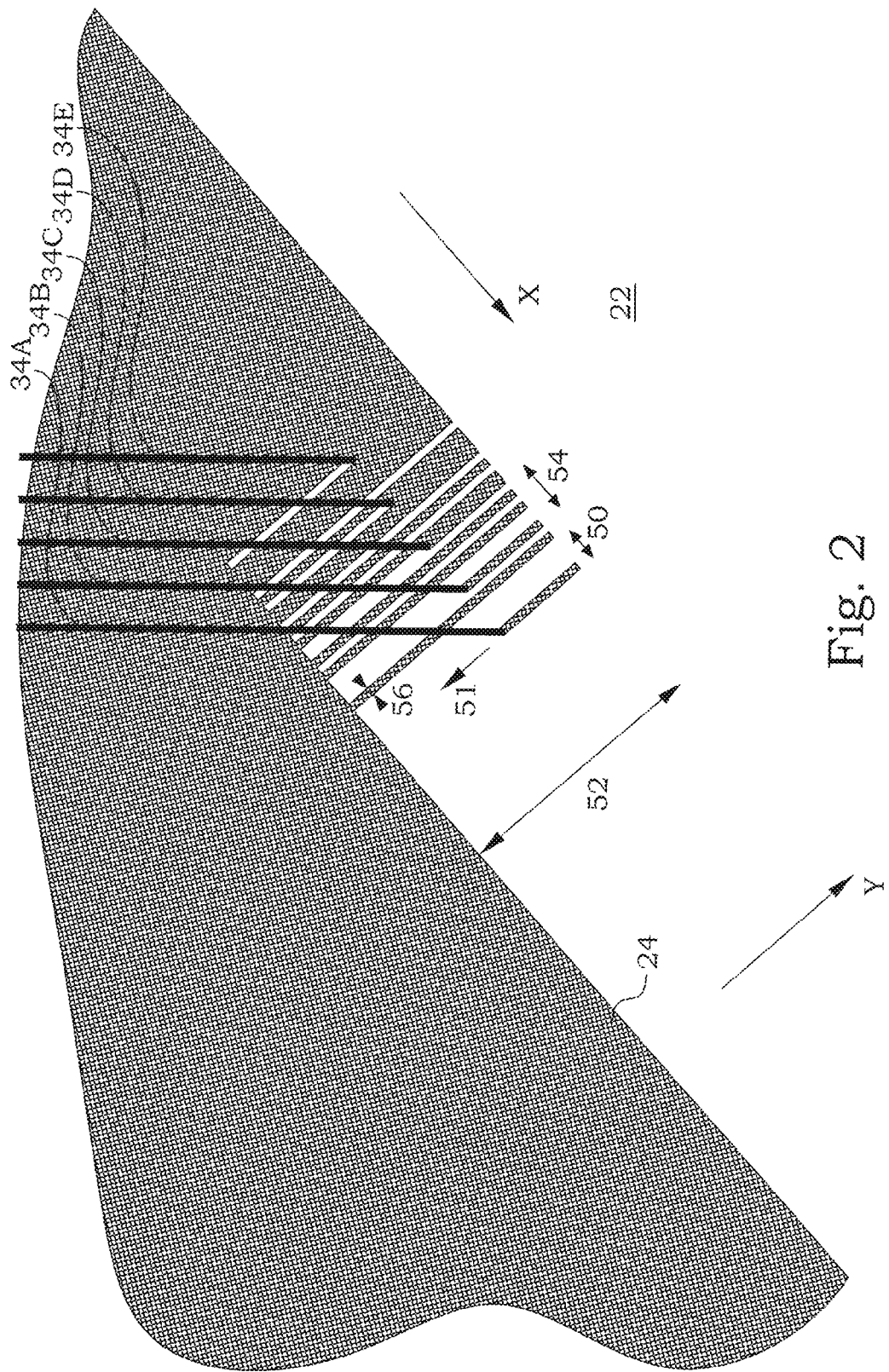
FIG. 2 illustrates a printing utilizing multiple exposure beams and microsweeping.

Throughout the drawings, the same reference numbers are used for similar or corresponding elements.

For a better understanding of the proposed technology, it may be useful to begin with a brief overview of a printing system utilizing multiple exposure beams with microsweep functionality.

FIG. 1 illustrates schematically a printing device 1 comprising a table 10, on which a workpiece support 12 is arranged. The workpiece support 12 is movable in a direction Y relative the table 10. On the workpiece support 12, a workpiece 20 is firmly attached. The surface of the workpiece 20 is provided with a layer sensitive to electromagnetic or particle radiation.

The printing device 1 further comprises a workpiece patterning device 2. The workpiece patterning device 2 comprises a stand 30 supporting a printing head 32. The printing head 32 is movable along the stand 30 in a direction X. The printing head 32 is arranged for providing a plurality of exposure beams 34 for exposure with electromagnetic or particle radiation, which exposure beams 34 are directed towards the workpiece 20.

The combined motion of the workpiece support 12 and the motion of the printing head 32 and, as will be described further below, by a microsweeping of the exposure beams 34, makes it possible to reach all areas on the workpiece 20 that are supposed to be exposed for radiation. In the figure, an exposed area 24 and an unexposed area 22 are illustrated.

As anyone skilled in the art realizes, the relative mechanical motions can in other embodiment also be achieved in other ways, e.g. that the printing head 30 is movable in two dimensions and/or that the workpiece support 12 is movable in two dimensions.

In the present type of printing device, multiple exposure beams and microsweeping of each exposure beam is utilized. FIG. 2 illustrates this in a schematic manner. A portion of the workpiece 20 is shown. In the illustrated moment, an exposed area 24 is illustrated by hatching and an unexposed area 22 is illustrated without. Here, it will be understood that the actual degree of exposure also depends on the intensity of the exposure beam at each position. However, in this figure, the "exposed area" 24 is the area over which a exposure beam has passed or should have passed if an intensity would have been applied at that instance.

In the figure, five exposure beams 34A-E are illustrated. As anyone skilled in the art understands, the number of exposure beams can be selected depending on e.g. requested printing speed, available exposure beam sizes, overall complexity etc. However, in this exemplifying illustration, five exposure beams 34A-E have been selected just in order to make the illustration of the printing principles easy to recognize.

In this illustration, the printing head (not shown) is movable stepwise in the X direction downwards in the illustration. The printing head moves with regular distances, illustrated as the exposure beam steps 50. At each position, the exposure beams are swept with a so-called microsweep along the Y direction upwards in the figure, to cover a sweep width 52. In the illustrated instance, the microsweep is almost performed half the way through the microsweep. After the microsweep is finished, the printing head is moved another exposure beam step 50 in the X direction and a new microsweep is made. As can be seen in the figure, when all exposure beams have passed a certain X position, the entire surface of the workpiece is (or could have been) exposed. The different exposure beams are thus planned to fill in the space between each other to build up an exposure of the entire surface. The exposure beam width 56 corresponds to the width of the microstripe that is exposed during a micosweep, and to cover the entire surface, the exposure beam width 56 times the number of exposure beams equals the exposure beam step 50. It can, however, be seen that the exposure beam separation 54 is different from the exposure beam step 50.

Figure 3:
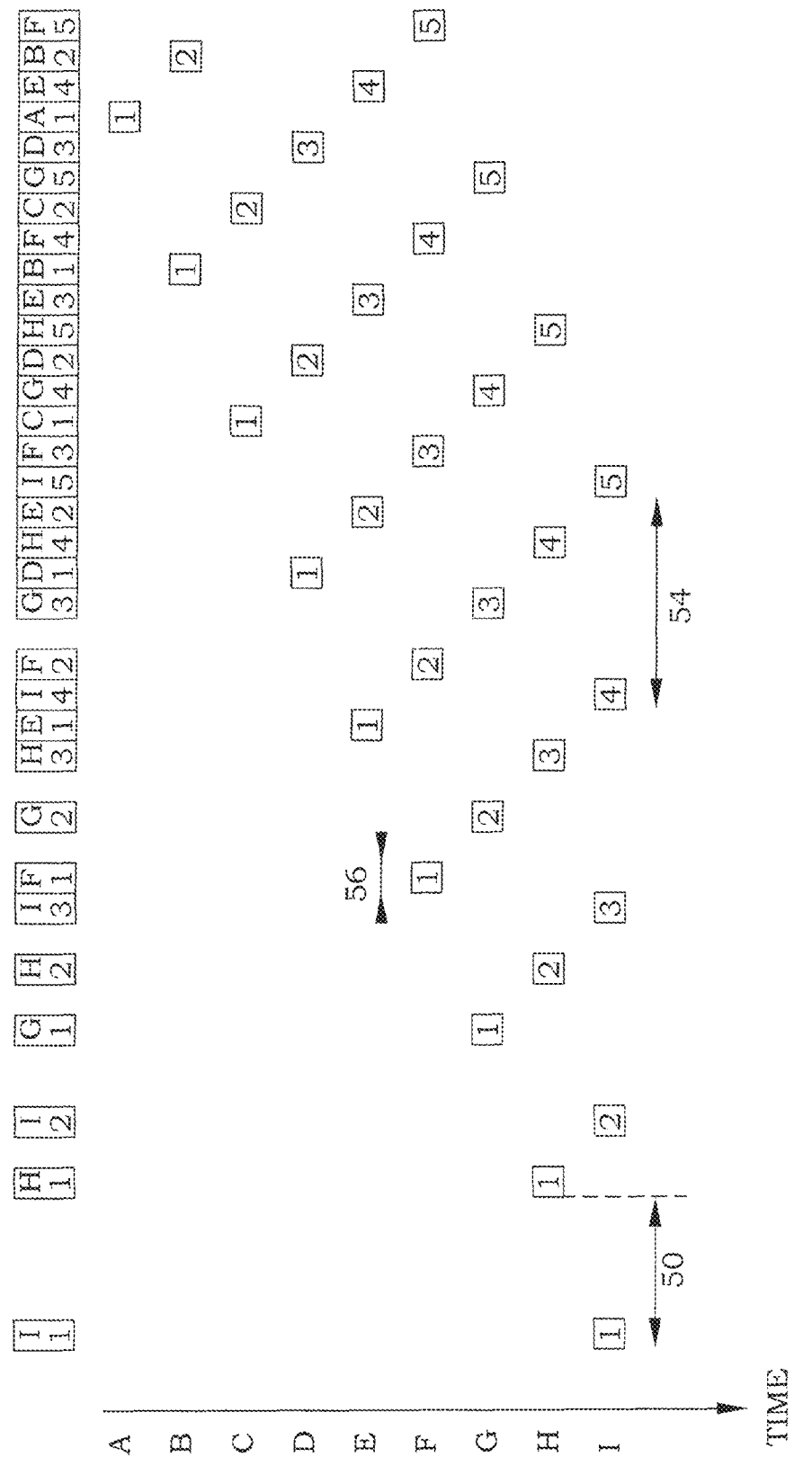
FIG. 3 illustrates schematically how an entire surface is covered by multiple exposure beams.

The motion of the printing head is planned in order for the different exposure beams to cover the entire surface of the workpiece 20. FIG. 3 illustrates one example of how this can be achieved. Also in this illustrative example, the number of exposure beams is selected to be five. The diagram is drawn with an intended time axis directed in the downward direction. and the printing head is moved horizontally by the exposure beam step 50 between each line of symbols. Each microsweep is here denoted by a letter in order to identify the time instant when it was made. At the top of the figure, the entire print is illustrated schematically, with an indication of the number of the exposure beam and the time instant when each part was printed.

In FIG. 4A, a part of the grid of beam exposures is shown in a larger scale. A line to be printed 60 is illustrated overlaid to the grid of exposure beams. The printing direction X is in the left direction in this example. The line to be printed 60 thus has a leading edge 62 and a trailing edge 64. The entire line to be printed 60 covers more than one exposure beam width 56. Furthermore, the edges 62, 64 of the line to be printed 60 are positioned within one respective exposure beam width 56. The intended position of the edge 62, 64 of the line to be printed 60 relative to an edge 55 of the intended coverage area of the exposure beam responsible for the printing the edge 62, 64 of the line to be printed 60 is defined as a grid fraction position 66L, 66T. In this example the leading edge 62 has a grid fraction position 66L and the trailing edge 64 has a grid fraction position 66T.

In FIG. 4B, another line to be printed 60 is illustrated, which is somewhat wider. The grid fraction position 66L, 66T are altered accordingly.

During printing, many types of errors or imperfections may occur. The actually illuminated area may not have the geometry or size that was assumed when designing the printing device, which may cause unintentional intensity variations both along the microsweep direction and in the exposure beam step direction. Such geometry imperfections may also differ along a microsweep. Furthermore, different exposure beams may behave differently, the exposure beam separation may not be exactly the intended one. Also, the microsweep of the exposure beams may not be perfectly straight, causing slightly bended or tilted microsweeps. Each of such imperfections may be too small to be corrected for mechanically or optically with a reasonable effort, but may together give rise to unacceptable printing errors.

All such imperfections will in some sense influence the printing of a perfect straight line. In FIG. 5A, an intended edge 64 of a straight line 60 is illustrated with a broken line. An example of an actually printed line has instead an edge 67 that is non-straight. The position of the actual edge 67 relative the intended edge 64 may be determined at a number of positions in the Y direction, preferably along the entire length. It is thus possible to quantify an error of each point in the Y direction. Furthermore, it is also known which exposure beam that is responsible for printing the edge.

Features that are smaller than a exposure beam width are typically approximated by adapting the exposure beam intensity. A feature that by definition shows an edge within the interior of a exposure beam width may be approximated by reducing the intensity of a corresponding exposure beam at that position. The actual behaviour of a straight edge being positioned within a exposure beam width may therefore also be dependent on where within the exposure beam width the edge is defined to be placed. In other words, the shape of an actual edge 67 may also be dependent on the grid fraction position of the intended edge 64. The quantified error of each point in the Y direction may therefore also be characterized by the corresponding grid fraction position.

One approach to correct for the printing errors in FIG. 5A would be to on purpose distort the intended edge 64 so that the printing errors result in a straight actually printed edge 67. This is illustrated in FIG. 5B. Here an "intended edge" 69 of a pattern 61 to be printed is defined to be curved. This curving is a compensation for the printing errors that are assumed to exist during the actual printing. The printing errors will therefore typically give an actually printed edge 67 that appears to be straight.

The compensations that have to be made may vary from one position along the microsweep to another. The compensations may also vary depending on which exposure beam that was used for printing the edge. The compensations may also vary depending on the grid fraction position of the line to be printed. This means that for each combination of microsweep position, exposure beam number and grid fraction position, a particular need for compensation maybe needed.

By measuring the actual errors that occur upon printing of straight lines in the Y direction for all combinations of a set of microsweep positions, a set of grid fraction positions and exposure beam numbers, a data matrix of needed corrections can be constructed. When a subsequent real pattern is to be printed, the intended pattern can be intentionally distorted according to the data matrix using the microsweep position, the grid fraction position, and the exposure beam number as matrix indices.

Figure 6:
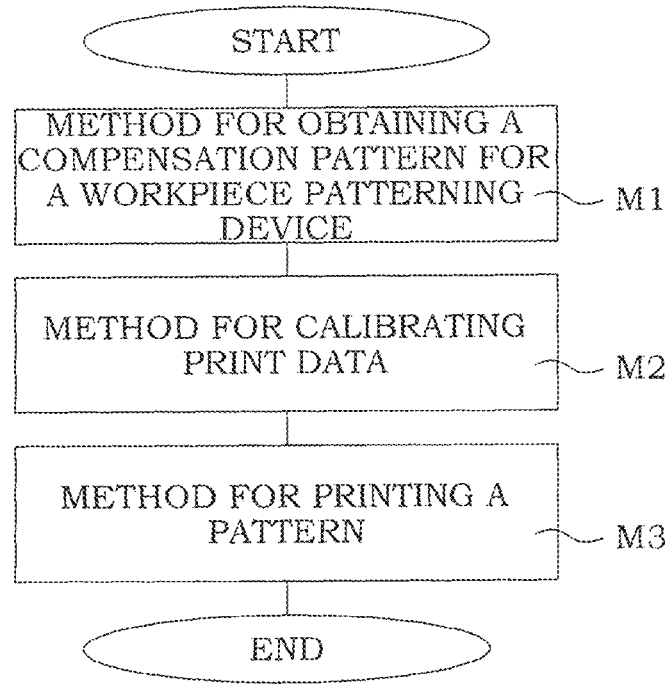
FIG. 6 illustrate part methods of an embodiment of a method for printing.

FIG. 6 illustrates a flow diagram of an embodiment of three methods used together for accomplishing a compensated print. A first method M1 is a method for obtaining a compensation pattern for a workpiece patterning device. This is, as will be described further below, preferably performed by printing patterns of intentionally straight lines and measuring the deviances in the finally printed pattern. The deviances are used to compute edge compensating data for adapting edge representations of pattern print data prior to printing to compensate for the deviations.

The second part method M2 is a method for calibrating print data. The calibration is made according to the edge compensating data computed in the first part method M1. The methods M1 and M2 may be performed at a same site, and even by a common processor. However, the method M2 may also be performed separated in time and space from the method M1. For instance, the edge compensating data may be provided to a distant processor for performing the actual calibration of print data.

The third part method M3 is a method for printing a pattern. Since the edge compensating data typically is unique for each printing device, the part method M3 has to be performed on the same printing device as was used in the first part method M1. The printing has furthermore to be performed using the calibrated print data from the part method M2. However, also here, the site where part method M3 is performed can be distance in time and space from the site where the part method M2 was performed. The part M2 may even be performed by another party than is operating the actual printing device.

Furthermore, the part method M3 may be performed a multiple of times using the same calibrated print data from part method M2. Likewise, the part method M2 may be performed a multiple of times for different patterns using the same edge compensating data from part method M1.

Figure 7:
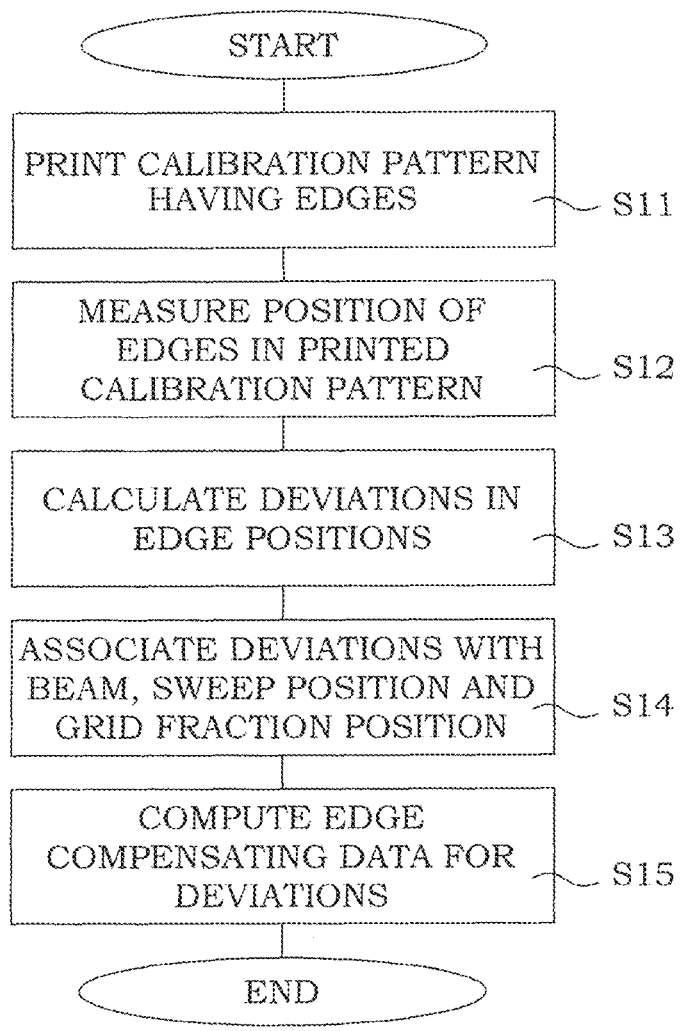
FIG. 7 is a flow diagram of steps of an embodiment of a method for obtaining a compensation pattern for a workpiece patterning device.

FIG. 7 illustrates a flow diagram of steps of an embodiment of a method for obtaining a compensation pattern for a workpiece patterning device. In step S11, a calibration pattern is printed with a plurality of simultaneously operating exposure beams separated in a first direction. The plurality of simultaneously operating exposure beams are sweepable in a second direction, transverse to the first direction. The printing is performed according to calibration pattern print data. The calibration pattern has a multitude of edges extending in the second direction.

In step 21, positions in the first direction of the edges are measured for a plurality of sweep positions in the second direction in the printed calibration pattern. The more positions in the second direction that are measured, the better will the compensation for imperfections along the microsweep be. However, the number of measuring positions will also increase the size of the final compensation data.

Deviations of the measured positions of the edges relative intended positions of the edges according to the calibration pattern print data are calculated in step S13. In step S14, each deviation is associated with a used exposure beam among the simultaneously operating exposure beams that is responsible for the printing of the respective edge. Each deviation is also associated with a particular sweep position of the plurality of positions in the second direction at which the edge was printed. Finally, each deviation is also associated with a grid fraction position in the first direction of the exposure beam among the simultaneously operating exposure beams that is responsible for the printing the respective edge. As discussed above, the grid fraction position is the intended position of the edge relative to an edge of an intended coverage area of the exposure beam among the simultaneously operating exposure beams that is responsible for the printing the respective edge.

In step S15, edge compensating data for adapting edge representations of pattern print data prior to printing to compensate for the calculated deviations is computed. The edge compensating data is dependent on the used exposure beam, the sweep position in the second direction and he grid fraction position in the first direction.

As briefly mentioned above, the edges of the calibration pattern can be of two different types; a leading edge or a trailing edge. In many printing devices, the behaviours of such different edges suffer from the same type of imperfections, depending on exposure beam number, sweep position and grid fraction position. In such cases, a same compensating data is valid for both types of edges.

However, in some printing devices, the necessary compensations may also ne dependent on whether the edge is a leading or trailing edge. Therefore, in one embodiment, the association of each deviation further comprises associating each deviation to be a leading edge or a trailing edge with reference the first direction. Thereby, the edge compensating data is further dependent on whether the edge to be compensated is a leading or trailing edge.

The calibration pattern should comprise edges directed in the second direction, i.e. parallel to the microsweep direction. In a preferred embodiment, in order to utilize the space in an efficient manner, the calibration pattern comprises lines in the second direction. Edges are then easily provided at positions of different exposure beams. In other words, width and position of the lines in the calibration pattern are adapted to cover all simultaneously operating exposure beams to be involved in the creation of at least one edge of said calibration pattern. Preferably, edges are also provided at different grid fraction positions for each exposure beam. The more different grid fraction positions of the edges in the first direction that are provided, the better will the compensation for imperfections across the microsweep. However, the number of grid fraction positions will also increase the size of the final compensation data and increase the time for performing the calibration. The number of grid fraction positions used is therefore preferably decided as a compromise between time, data size and correction quality.

In a preferred embodiment, the calibration pattern comprises reference lines. The reference lines have a width that ensures that leading and trailing edges are provided by a same sweep in the second direction of the plurality of simultaneously operating exposure beams. In other words, both edges of the reference lines should be printed without moving the printing head in the X direction. At the contrary, the inner parts of the reference lines may be provided by an earlier or later sweep by any exposure beam. By having the edges printed in a same sweep, any imperfections in the motion of the printing head in the X direction can be excluded.

Figure 8:
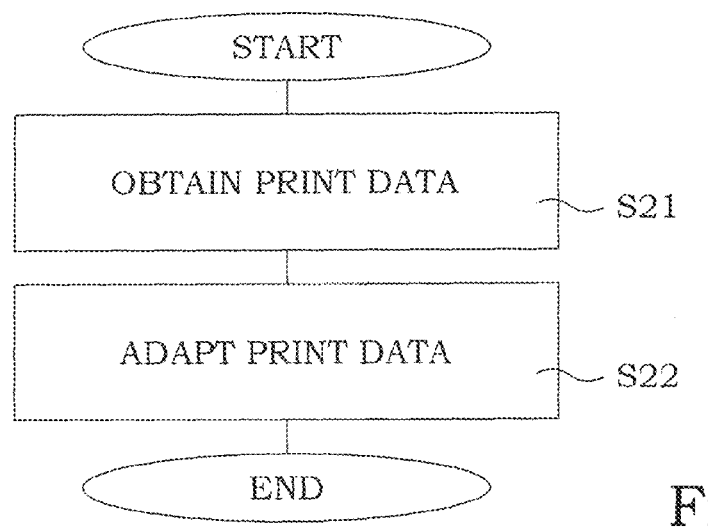
FIG. 8 is a flow diagram of steps of an embodiment of a method for calibrating print data.

FIG. 8 illustrates a flow diagram of steps of a method for calibrating print data. In step S21, print data of the pattern to be printed is obtained. In step S22, the print data is adapted by edge compensating data into edge compensated print data. The edge compensating data is obtained by a part method M1 of FIG. 6, e.g. according to FIG. 7.

Figure 9A:
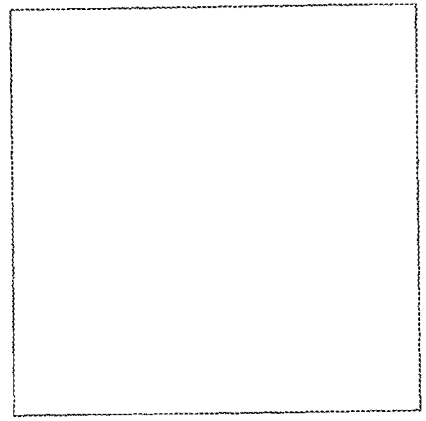
FIGS. 9A-C illustrate edge compensation of vector print data.

Typically, print data are originally provided as vector print data. The objects to be printed are then defined by parameters typically describing the type of object, size and position. For instance, if a square is to be printed, a definition code of a square shape together with e.g. the width, height, rotation, and corner position in X and Y directions are enough for defining the object. Alternatively, the edges of an object can be defined, by shape, start and end position. A square would then be characterized by four straight lines connecting four points. The vector print data is a convenient way to describe relatively simple shapes in a very data-efficient manner. This is schematically illustrated in FIG. 9A. Here a square is shown.

In one embodiment, the edge compensating data is vector edge compensating data. Such vector edge compensating data comprises data defining shape changes of pattern structures, in vector print data, representing an edge in the first direction. This means that positions, dimensions and even shapes may have to be re-defined.

Figure 9B:
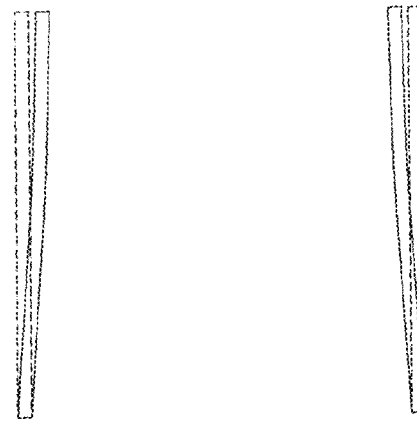

In a particular embodiment, the vector edge compensating data comprises data that causes a moving of the edge in the first direction that is equal in amount but oppositely directed compared to a corresponding deviation of the measured positions of the edges relative intended positions of the edges according to the calibration pattern print data. In FIG. 9B, a print of a calibration pattern of a same area is shown. The lines in the printed calibration pattern are tilted with respect to the intended lines, illustrated by dotted lines.

Figure 9C:
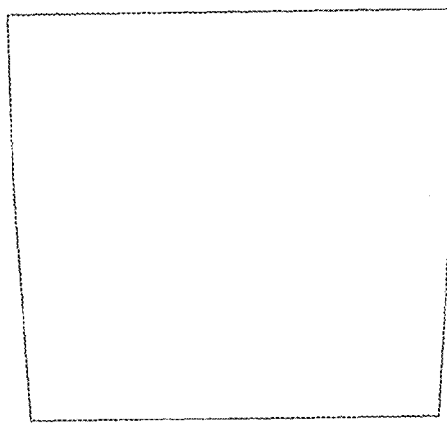

In FIG. 9C, compensated vector print data is illustrated, where the sides of the original square are tilted to compensate for the errors detected during the calibration run.

Note that the indicated errors in FIGS. 9A and 9B are illustrated extremely exaggerated, compared to typical cases in practice, in order to be able to visualize the compensation strategy.

If returning to FIG. 8, the edge compensating data in the adaption in step S22 is vector edge compensating data. This vector edge compensating data comprises data defining shape changes of pattern structures, in vector print data, representing an edge in the first direction. The step S22 of adapting the print data thereby comprises changing of shapes of pattern structures in the vector print data according to vector edge compensating data obtained by the ideas described here above.

In a preferred embodiment based on vector print data, the vector edge compensating data comprises data causing a move of the edge in the first direction that is equal in amount to but oppositely directed compared to a corresponding deviation of the measured positions of the edges relative intended positions of the edges according to the calibration pattern print data.

As can be understood by anyone skilled in the art, the resulting shapes of the objects of the compensated vector print data may be, depending on the actual compensation that is made, complex and might be difficult to define in a simple vector representation. However, in most printing devices, the vector print data is transformed into bit map print data before the actual printing is made. There are also printing devices that request the original data to be provided in a bit map print data format already from the beginning. In both these cases, a compensation according to the present ideas can be made in the bit map print data instead.

Figure 10A:
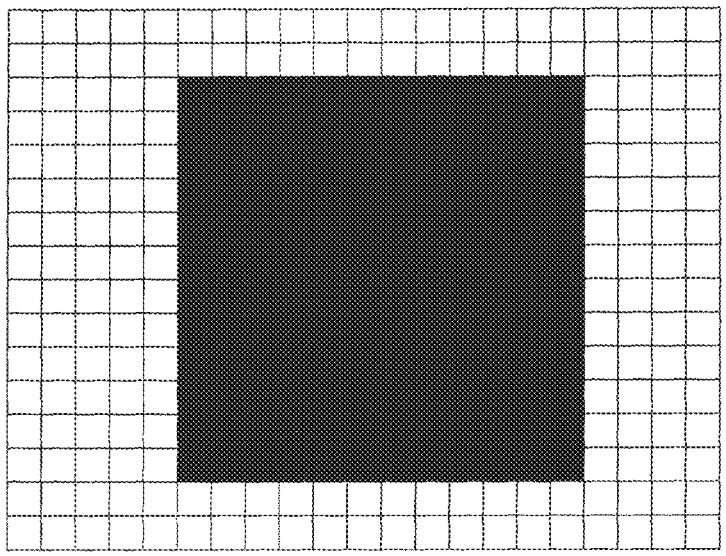
FIGS. 10A-C illustrate edge compensation of bit map print data.
Figure 10B:
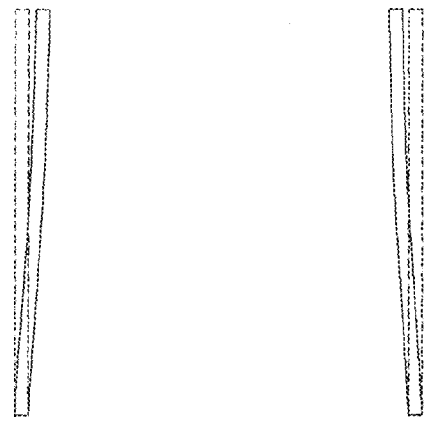
Figure 10C:
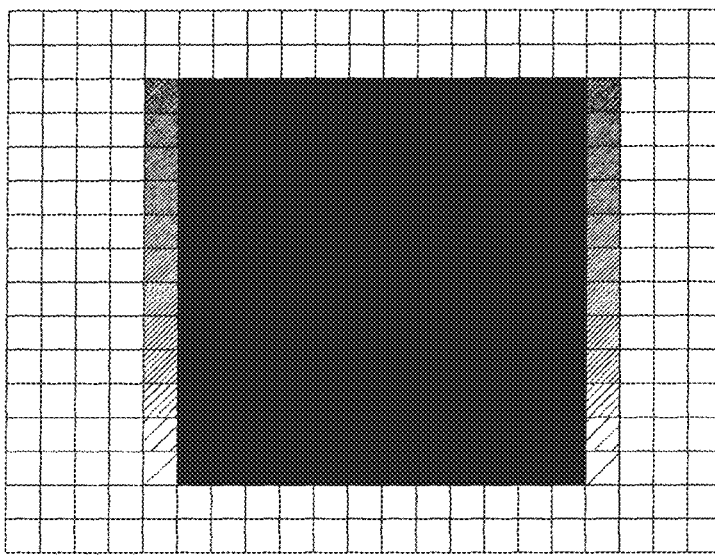

An example of bit map print data is illustrated in FIG. 10A. Here, a square is defined by a matrix of bits marked to have a certain intensity. Compensation in bit map print data can be performed by adjusting the intensity settings of the bits in vicinity of the edge in question. FIG. 10B illustrates the measured deviations between intended and measured calibration patterns. FIG. 10C illustrates a compensated bit map print data, where intensities of the bits in vicinity of the edges are adjusted.

In other words, in one embodiment, the edge compensating data is bit map edge compensating data. The bit map edge compensating data comprises data defining intensity adjustments of individual bits, in bit map print data, representing an edge in the first direction.

Preferably, the bit map edge compensating data comprises data defining an increase in intensity adjustments of individual bits, in the bit map print data, representing the edge in the first direction if the edge of the printed pattern is positioned inside the corresponding edge position according to the calibration pattern print data. The bit map edge compensating data comprises data defining a decrease in intensity adjustments of individual bits, in the bit map print data, representing the edge in the first direction if the edge of the printed pattern is positioned outside the corresponding edge position according to the calibration pattern print data.

Preferably, the amount of the increase or decrease, respectively, of the intensity is dependent on the size of a corresponding deviation of the measured positions of the edges relative intended positions of the edges according to said calibration pattern print data.

In one embodiment, the bit map edge compensating data is provided as a data matrix having the used exposure beam, the sweep position in the second direction and the grid fraction position in the first direction as matrix indices.

Returning again to FIG. 8, the edge compensating data is bit map edge compensating data in the present embodiment. Preferably, this bit map edge compensating data comprises data defining intensity adjustments of individual bits, in bit map print data, representing an edge in the first direction. Thereby, the step of adapting S22 the print data comprises adjusting an intensity of individual bits in the bit map print data according to bit map edge compensating data. The bit map edge compensating data is preferably obtained by a method according to the ideas presented here above.

Preferably, the bit map edge compensating data is provided as a data matrix. The step of adapting S22 the print data comprises retrieving of intensity adjustment values for individual bits in the bit map print data using the used exposure beam, the sweep position in the second direction and the grid fraction position in the first direction as matrix indices.

Figure 11:
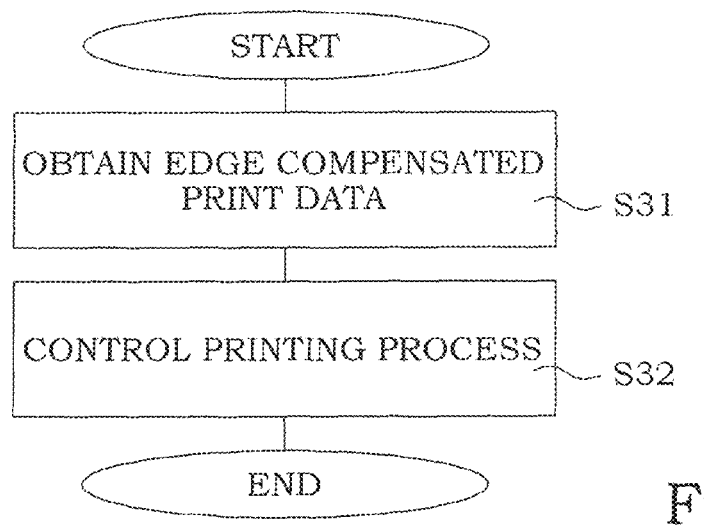
FIG. 11 is a flow diagram of steps of an embodiment of a method for printing a pattern.

FIG. 11 illustrates a flow diagram of steps of an embodiment of a method for printing a pattern. In step S31, edge compensated print data obtained by a method for calibrating print data is obtained. The method for calibrating print data is the part method M2 of FIG. 2 and is preferably performed according to FIG. 8. In step S32, a printing process of a workpiece is controlled based on the edge corrected print data. The workpiece is a workpiece covered at least partly with a layer sensitive to electromagnetic or electron radiation.

Preferably, the step of controlling S32 the printing process comprises controlling simultaneously operating exposure beams to provide microsweeps in the second direction while being scanned in the first direction, thereby creating scan strips.

More preferably, the step of controlling S32 the printing process further comprises creating multiple scan strips displaced in the second direction.

In one embodiment, the printing process is a microlithographic printing process. Preferably, the printing process is a mask writing process or a direct writing process.

Figure 12:
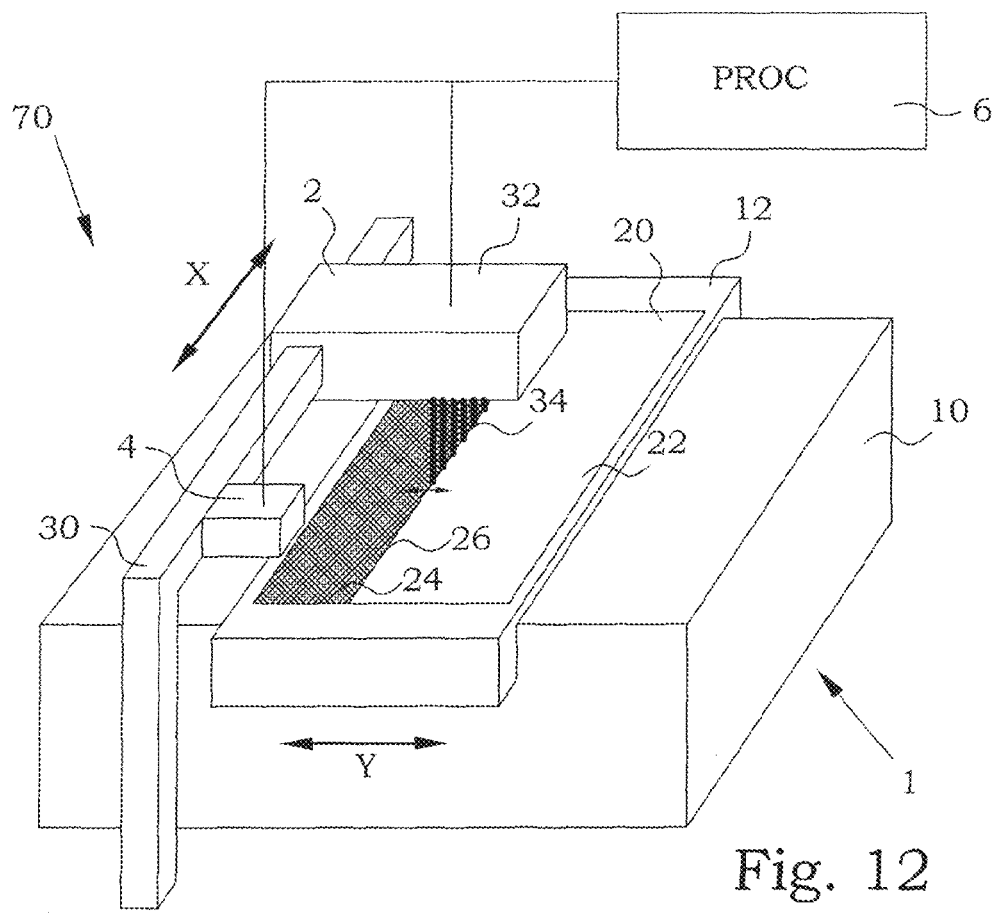
FIG. 12 is a schematic drawing of an embodiment of a system for obtaining a compensation pattern for a workpiece patterning device.

FIG. 12 illustrates schematically an embodiment of a system 70 for obtaining a compensation pattern for a workpiece patterning device. The system 70 for obtaining a compensation pattern for a workpiece patterning device comprises a printing device 1 configured for creating a calibration pattern with a plurality of simultaneously operating exposure beams separated in a first direction. The plurality of simultaneously operating exposure beams are sweepable in a second direction, transverse to the first direction. One example of such a printing device 1 is also shown in FIG. 1. The printing device is configured to perform a printing according to calibration pattern print data. This calibration pattern has a multitude of edges extending in the second direction.

The system 70 for obtaining a compensation pattern for a workpiece patterning device further comprises a measuring device 4 arranged for measuring positions of the edges in the first direction for a plurality of sweep positions in the second direction in the calibration pattern. In the illustration, the measuring device 4 is illustrated as a separate unit arranged on a stand of the printing device 1. However, the measuring device 4 may also be provided as a totally separate unit, or as an integrated part of the printing head 32. Measuring devices 4, as such, are well known in prior art and are available in many different configurations. However, as long as the measuring device provides the edge positions, data representing such edge positions or data from which such edge positions can be deduced, the details of the measuring device 4 are non-essential, and will therefore not be further described.

The system 70 for obtaining a compensation pattern for a workpiece patterning device further comprises a processing device 6. The processing device 6 is connected to the printing device 1 as well as the measuring device 4. The processing device 6 is configured for calculating deviations of the measured positions of the edges relative intended positions of the edges according to the calibration pattern print data. The processing device 6 is further configured for associating each deviation with a used exposure beam among the simultaneously operating exposure beams that is responsible for the printing of the respective edge, with a sweep position of the plurality of positions in the second direction at which the edge was printed and with a grid fraction position in the first direction of the exposure beam among the simultaneously operating exposure beams that is responsible for the printing the respective edge. As before, the grid fraction position is the intended position of the edge relative to an edge of an intended coverage area of the exposure beam among the simultaneously operating exposure beams that is responsible for the printing the respective edge.

The processing device 6 is further configured for computing edge compensating data for adapting edge representations of pattern print data prior to printing to compensate for the calculated deviations. The edge compensating data is dependent on the used exposure beam, the sweep position in the second direction and the grid fraction position in the first direction.

In one embodiment, the edge compensating data is bit map edge compensating data, comprising data defining intensity adjustments of individual bits, in bit map print data, representing an edge in the first direction. Preferably, the bit map edge compensating data comprises data defining an increase in intensity adjustments of individual bits, in the bit map print data, representing the edge in the first direction if the edge of the printed pattern is positioned inside the corresponding edge position according to the calibration pattern print data. Likewise, the bit map edge compensating data comprises data defining a decrease in intensity adjustments of individual bits, in the bit map print data, representing the edge in the first direction if the edge of the printed pattern is positioned outside the corresponding edge position according to the calibration pattern print data. More preferably, the amount of the increase or decrease, respectively, of the intensity is dependent on the size of a corresponding deviation of the measured positions of the edges relative intended positions of the edges according to the calibration pattern print data.

In one embodiment, the bit map edge compensating data is provided as a data matrix having the used exposure beam, the sweep position in the second direction and the grid fraction position in the first direction as matrix indices.

In another embodiment, the edge compensating data is vector edge compensating data, comprising data defining shape changes of pattern structures, in vector print data, representing an edge in the first direction. Preferably, the vector edge compensating data comprises data causing a move of the edge in the first direction being equal the in amount but oppositely directed compared to a corresponding deviation of the measured positions of the edges relative intended positions of the edges according to the calibration pattern print data.

FIG. 13A illustrates schematically an embodiment of a device 80 for processing print data defining a pattern to be printed. The device 80 for processing print data defining a pattern to be printed comprise a processing circuitry 8 and a memory 7. The memory 7 comprises instructions executable by the processing circuitry 8, whereby the processing circuitry 8 is operative toobtain print data for the pattern to be printed and to adapt the print data by edge compensating data into edge compensated print data. The edge compensating data is obtained by a system 70 for obtaining a compensation pattern, e.g. according to the embodiment of FIG. 12.

In one embodiment, the processing circuitry 8 is operative to adapt the print data into edge compensated print data by bit map edge compensating data obtained by the system 70. The processing circuitry 8 is further operative to adjust intensity of individual bits, in bit map print data, representing an edge in the first direction. Preferably, the bit map edge compensating data is provided as a data matrix, wherein the processing circuitry 8 is further operative to retrieve an intensity adjustment from the data matrix using the exposure beam, the sweep position in the second direction and the grid fraction position in the first direction as matrix indices.

In another embodiment, the processing circuitry 8 is operative to adapt the print data by vector edge compensating data obtained by the system 70 for obtaining a compensation pattern. The vector edge compensating data comprises data defining shape changes of pattern structures, in vector print data, representing an edge in the first direction. Preferably, the vector edge compensating data comprises data causing a move of the edge in the first direction that is equal in amount to but oppositely directed compared to a corresponding deviation of the measured positions of the edges relative intended positions of the edges according to the calibration pattern print data. The processing circuitry is operative to adapt vector print data accordingly.

In FIG. 13A, the device 80 for processing print data defining a pattern to be printed is illustrated as a separate unit, in communication with the system 70 for obtaining a compensation pattern. However, as illustrated schematically in FIG. 13B, the device 80 for processing print data defining a pattern to be printed may also be provided as a part of and/or integrated in the system 70 for obtaining a compensation pattern. Preferably, the processing circuitry 8 constitutes a part of the processing device 6.

FIG. 14 illustrates schematically an embodiment of a printing device 1. The printing device 1 comprises a device 9 for processing of edge compensated print data obtained by a device 80 for processing print data according to the ideas presented here above. The printing device 1 is the printing device of the system 70 for obtaining a compensation pattern for a workpiece patterning device. The printing device 1 comprises a printing head 32 having a plurality of simultaneously operating exposure beams separated in a first direction. The plurality of simultaneously operating exposure beams are sweepable in a second direction, transverse to the first direction. The printing device 1 further comprises a control unit 5. The control unit 5 is arranged to control an operation and relative motion of the printing head based on the edge compensated print data.

In FIG. 14, the control unit 5 and the device 9 for processing of edge compensated print data are illustrated as separate units. However, they may also be integrated into a common unit. Also, the processing circuitry of the device 80 for processing print data may be integrated in the same unit as the control unit 5 and/or the device 9 for processing of edge compensated print data. Also, the processing device 6 can be a part of a common unit.

The embodiments described above are to be understood as a few illustrative examples of the present invention. It will be understood by those skilled in the art that various modifications, combinations and changes may be made to the embodiments without departing from the scope of the present invention. In particular, different part solutions in the different embodiments can be combined in other configurations, where technically possible. The scope of the present invention is, however, defined by the appended claims.

The invention claimed is:

1. A method for obtaining a compensation pattern for a workpiece patterning device, comprising the steps of:
    printing a calibration pattern with a plurality of simultaneously operating exposure beams separated in a first direction;
    said plurality of simultaneously operating exposure beams being sweepable in a second direction, transverse to said first direction;
    said printing being performed according to calibration pattern print data;
    said calibration pattern having a multitude of edges extending in said second direction;
    measuring positions of said edges in said first direction for a plurality of sweep positions in said second direction in said printed calibration pattern;
    calculating deviations of said measured positions of said edges relative intended positions of said edges according to said calibration pattern print data;
    associating each deviation with a used exposure beam among said simultaneously operating exposure beams being responsible for the printing the respective edge, with a sweep position of said plurality of positions in said second direction at which said edge was printed and with a grid fraction position in said first direction of said exposure beam among said simultaneously operating exposure beams, being responsible for the printing the respective edge;
    said grid fraction position being said intended position of said edge relative to an edge of an intended coverage area of said exposure beam among said simultaneously operating exposure beams being responsible for the printing the respective edge;
    computing edge compensating data for adapting edge representations of pattern print data prior to printing to compensate for said calculated deviations;
    said edge compensating data being dependent on said used exposure beam, said sweep position in said second direction and said grid fraction position in said first direction.

2. The method according to claim 1, wherein
    said edge compensating data is bit map edge compensating data, comprising data defining intensity adjustments of individual bits, in bit map print data, representing an edge in said first direction.

3. The method according to claim 2, wherein
    said bit map edge compensating data, comprising data defining an increase in intensity adjustments of individual bits, in said bit map print data, representing said edge in said first direction if said edge of said printed pattern is positioned inside the corresponding edge position according to said calibration pattern print data; and
    said bit map edge compensating data, comprising data defining a decrease in intensity adjustments of individual bits, in said bit map print data, representing said edge in said first direction if said edge of said printed pattern is positioned outside the corresponding edge position according to said calibration pattern print data.

4. The method according to claim 3, wherein
    the amount of said increase or decrease, respectively, of said intensity is dependent on the size of a corresponding said deviation of said measured positions of said edges relative intended positions of said edges according to said calibration pattern print data.

5. The method according to claim 4, wherein said bit map edge compensating data is provided as a data matrix having said used exposure beam, said sweep position in said second direction and said grid fraction position in said first direction as matrix indices.

6. The method according to claim 3, wherein said bit map edge compensating data is provided as a data matrix having said used exposure beam, said sweep position in said second direction and said grid fraction position in said first direction as matrix indices.

7. The method according to claim 2,
    wherein said bit map edge compensating data is provided as a data matrix having said used exposure beam, said sweep position in said second direction and said grid fraction position in said first direction as matrix indices.

8. The method according to claim 2, wherein said associating of each deviation further comprises associating each deviation to be a leading edge or a trailing edge with reference said first direction, whereby said edge compensating data being further dependent on whether the edge to be compensated is a leading or trailing edge.

9. The method according to claim 2, wherein said calibration pattern comprises lines in said second direction.

10. The method according to claim 1, wherein
    said edge compensating data is vector edge compensating data, comprising data defining shape changes of pattern structures, in vector print data, representing an edge in said first direction.

11. The method according to claim 10, wherein
    said vector edge compensating data comprises data causing a move of said edge in said first direction being equal said in amount but oppositely directed compared to a corresponding deviation of said measured positions of said edges relative intended positions of said edges according to said calibration pattern print data.

12. The method according to claim 1,
    wherein said associating of each deviation further comprises associating each deviation to be a leading edge or a trailing edge with reference said first direction, whereby said edge compensating data being further dependent on whether the edge to be compensated is a leading or trailing edge.

13. The method according to claim 1,
    wherein said calibration pattern comprises lines in said second direction Y.

14. The method according to claim 13, wherein said calibration pattern comprises reference lines having a width ensuring that leading and trailing edges may be provided by a same sweep in said second direction of said plurality of simultaneously operating exposure beams.

15. The method according to claim 13, wherein width and position of said lines in said calibration pattern are adapted to cover all simultaneously operating exposure beams to be involved in the creation of at least one edge of said calibration pattern.

16. A method for calibrating print data, comprising the steps of:
obtaining print data of said pattern to be printed; and
adapting said print data by edge compensating data obtained by a method according to claim 1 into edge compensated print data.

17. A method for printing a pattern, comprising the steps of:
obtaining edge compensated print data obtained by a method according to claim 16 of said pattern to be printed; and
controlling a printing process of a workpiece covered at least partly with a layer sensitive to electromagnetic or electron radiation based on said edge corrected print data.

18. A system for obtaining a compensation pattern for a workpiece patterning device, comprising:
a printing device configured for creating a calibration pattern with a plurality of simultaneously operating exposure beams separated in a first direction;
said plurality of simultaneously operating exposure beams being sweepable in a second direction, transverse to said first direction;
said printing device being configured to perform said printing according to calibration pattern print data;
said calibration pattern having a multitude of edges extending in said second direction;
a measuring device arranged for measuring positions of said edges in said first direction for a plurality of sweep positions in said second direction in said printed calibration pattern; and
a processing device configured for calculating deviations of said measured positions of said edges relative intended positions of said edges according to said calibration pattern print data;
said processing device being further configured for associating each deviation with a used exposure beam among said simultaneously operating exposure beams being responsible for the printing the respective edge, with a sweep position of said plurality of positions in said second direction at which said edge was printed and with a grid fraction position in said first direction of said exposure beam among said simultaneously operating exposure beams being responsible for the printing the respective edge;
said grid fraction position being said intended position of said edge relative to an edge of an intended coverage area of said exposure beam among said simultaneously operating exposure beams being responsible for the printing the respective edge;
said processing device being further configured for computing edge compensating data for adapting edge representations of pattern print data prior to printing to compensate for said calculated deviations;
said edge compensating data being dependent on said used exposure beam, said sweep position in said second direction and said grid fraction position in said first direction.

19. A device for processing print data defining a pattern to be printed, comprising:
processing circuitry; and
a memory;
said memory comprising instructions executable by the processing circuitry, whereby the processing circuitry is operative to:
obtain print data for said pattern to be printed; and to
adapt said print data by edge compensating data obtained by a system for obtaining a compensation pattern according to claim 18 into edge compensated print data.

20. A printing device comprising:
a device for processing of edge compensated print data obtained by a device for processing print data according to claim 19;
whereby said printing device being the printing device of said system for obtaining a compensation pattern for a workpiece patterning device of claim 18;
a printing head having a plurality of simultaneously operating exposure beams separated in a first direction;
said plurality of simultaneously operating exposure beams being sweepable in a second direction, transverse to said first direction; and
a control unit;
said control unit being arranged to control an operation and relative motion of said printing head based on said edge compensated print data.

* * * * *